US011657195B2

(12) United States Patent
Randon et al.

(10) Patent No.: US 11,657,195 B2
(45) Date of Patent: May 23, 2023

(54) PROCESSING A 3D SIGNAL OF A SHAPE ATTRIBUTE OVER A REAL OBJECT

(71) Applicant: DASSAULT SYSTEMES, Velizy Villacoublay (FR)

(72) Inventors: Guillaume Randon, Velizy Villacoublay (FR); Eloi Mehr, Velizy Villacoublay (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 352 days.

(21) Appl. No.: 17/102,254

(22) Filed: Nov. 23, 2020

(65) Prior Publication Data

US 2021/0157961 A1 May 27, 2021

(30) Foreign Application Priority Data

Nov. 21, 2019 (EP) .................................... 19306502

(51) Int. Cl.
*G06F 30/23* (2020.01)
*G06F 30/12* (2020.01)
(Continued)

(52) U.S. Cl.
CPC .............. *G06F 30/23* (2020.01); *G06F 30/12* (2020.01); *G06F 30/27* (2020.01); *G06N 3/08* (2013.01);
(Continued)

(58) Field of Classification Search
CPC ................. G06F 30/27; G06T 2200/04; G06T 2207/10028; G06T 2207/20072
See application file for complete search history.

(56) References Cited

U.S. PATENT DOCUMENTS

2003/0206165 A1* 11/2003 Hoppe .................... G06T 17/20
345/420
2009/0009513 A1* 1/2009 van den Hengel ..... G06T 17/20
345/420
(Continued)

OTHER PUBLICATIONS

Y. Yemez, "Shape from silhouette using topology-adaptive mesh deformation", Oct. 2009, Pattern Recognition Letters, vol. 30, pp. 1198-1207 (Year: 2009).*
(Continued)

*Primary Examiner* — Terrell M Robinson
(74) *Attorney, Agent, or Firm* — Oblon, McClelland, Maier & Neustadt, L.L.P.

(57) ABSTRACT

A method for processing a shape attribute 3D signal including providing a graph having nodes and arcs, each node representing a point of a 3D discrete representation, each arc representing neighboring points of the representation, providing a set of values representing a distribution of the shape attribute, each value being associated to a node and representing the shape attribute at the point represented by the node, minimizing energy on a Markov Random Field on the graph, the energy penalizing, for each arc connecting a first node associated to a first value to a second node associated to a second value, highness of an increasing function of a distance between the first and second value, a distance between a first point, represented by the first node, and a medial geometrical element of the representation, and a distance between a second point, represented by the second node, and the medial geometrical element.

20 Claims, 9 Drawing Sheets

(51) Int. Cl.
  *G06F 30/27* (2020.01)
  *G06N 3/08* (2023.01)
  *G06T 17/20* (2006.01)
(52) U.S. Cl.
  CPC .......... *G06T 17/20* (2013.01); *G06T 2200/04* (2013.01); *G06T 2207/10028* (2013.01); *G06T 2207/20072* (2013.01)

(56) References Cited

U.S. PATENT DOCUMENTS

| | | | |
|---|---|---|---|
| 2009/0202160 A1* | 8/2009 | Kim | G06T 17/20 382/233 |
| 2011/0295564 A1* | 12/2011 | Chazal | G06T 17/10 703/1 |
| 2016/0171765 A1* | 6/2016 | Mehr | G06T 17/20 345/419 |
| 2017/0193699 A1* | 7/2017 | Mehr | G06T 17/205 |
| 2018/0108137 A1* | 4/2018 | Price | G06N 3/045 |
| 2019/0147642 A1* | 5/2019 | Cole | G06V 10/454 345/419 |
| 2020/0042863 A1* | 2/2020 | Wang | G06N 3/04 |
| 2020/0211281 A1* | 7/2020 | Randon | G06T 17/20 |

OTHER PUBLICATIONS

Y. Yemez, "Shape from silhouette using topology-adaptive mesh deformation", Oct. 2009, Pattern Recognition Letter, vol. 30, pp. 1198-1207 (Year: 2009).*

Yu-Mei, Hong, "Surface reconstruction of 3D objects using local moving least squares and K-D trees," 2017 International Conference on Image and Vision Computing New Zealand (IVCNZ) 2017, pp. 1-6 (Year: 2017).*

D. Thuerck, et al.; "A Fast, Massively Parallel Solver for Large, Irregular Pairwise Markov Random Fields"; High Performance Graphics (2016); ULF Assarsson and Warren Hunt (Editors); Eurographics Proceedings; 11 pages.

Andrea Tagliasacchi, et al.; "3D Skeletons: A State-of-the-Art Report"; EUROGRAPHICS 2016; J.Madeira and G.Patow (Guest Editors); vol. 35 (2016), No. 2; STAR—State of the Art Report; 25 pages.

Andrea Tagliasacchi, et al.; "Mean Curvature Skeletons"; Eurographics Symposium on Geometry Processing 2012; Eitan Grinspun and Niloy Mitra (Guest Editors); vol. 27 (2008); No. 1; 10 pages.

Daniel Rebain, et al.; "LSMAT Least Squares Medial Axis Transform"; Computer Graphics Forum; vol. 00 (2019); No. 00; 14 pages.

Guillaume Lavoue, et al.; "Markov Random Fields for Improving 3D Mesh Analysis and Segmentation"; Eurographics Workshop on 3D Object Retrieval (2008); I. Pratikakis and T. Theoharis (Editors); 9 pages.

Junjie Cao, et al.; "Point Cloud Skeletons via Laplacian-Based Contraction"; 2010; 11 pages.

Marcel Haselich, et al.; "Terrain Classification with Markov Random Fields on Fused Camera and 3D Laser Range Data"; 2011; 6 pages.

Thomas Delame, et al.; "Structuring 3D Medial Skeletons: A Comparative Study"; Vision, Modeling, and Visualization (2016); M. Hullin, M. Stamminger, and T. Weinkauf (Editors); 9 pages.

Julien Dardenne, et al.; "Exploiting Curvature to Compute the Medial Axis with Constrained Centroidal Voronoi Diagram on Discrete Data"; Conference Paper in Proceedings / ICIP . . . International Conference on Image Processing—Dec. 2009; 5 pages.

Vedrana Andersen, et al.; "Markov Random Fields on Triangle Meshes"; Technical University of Denmark; Published in 18$^{th}$ International Conference in Central Europe on Computer Graphics, Visualization and Computer Vision; 2010; 7 pages.

Nina Amenta, et al.; "Surface Reconstruction by Voronoi Filtering"; 1999; 10 pages.

Extended Search Report dated May 12, 2020 in European Patent Application No. 19306502.6-1210; 6 pages.

Lior Shapira, et al.; "Consistent Mesh Partitioning and Skeletonisation Using the Shape Diameter Function"; The Visual Computer; International Journal of Computer Graphics, Springer, Berlin; DE; vol. 24, No. 4; Jan. 8, 2008; XP019588645; ISSN: 1432-2315; 6 pages.

Zhenfeng Shi, et al.; "3D Mesh Segmentation Based on Markov Random Fields and Graph Cuts"; IEICE Transactions on Information and Systems; vol. E95-D, No. 2; Jan. 1, 2012; XP055690693; ISSN: 0916-8532; 6 pages.

* cited by examiner

PROCESSING A 3D SIGNAL OF A SHAPE ATTRIBUTE OVER A REAL OBJECT

CROSS-REFERENCE

This application claims priority under 35 U.S.C. § 119 or 365 to European Application No. 19306502.6, filed Nov. 21, 2019. The entire contents of the above application(s) are incorporated herein by reference.

FIELD

The disclosure relates to the field of computer programs and systems, and more specifically to a method, system and program for processing a 3D signal of a shape attribute over a real object.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role with regard to the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Within this context and other contexts, processing a 3D signal of a shape attribute over a real object happens to be often very useful.

Existing methods for processing a 3D signal of a shape attribute over a real object suffer from a lack of accuracy.

Within this context, there is a need for an improved method for processing a 3D signal of a shape attribute over a real object.

SUMMARY

It is therefore provided a computer-implemented method for processing a 3D signal of a shape attribute over a real object. The method comprises providing a graph having nodes and arcs. Each node represents a respective point of a measured 3D discrete representation of the real object. Each arc connects two nodes representing neighboring points of the discrete representation. The method further comprises providing a set of values representing a distribution of the shape attribute over the real object. Each value is associated to a respective node of the graph and represents the shape attribute at the respective point represented by the respective node. The method further comprises modifying the set of values by minimizing an energy defined on a Markov Random Field formed on the graph. The energy penalizes, for each arc connecting a first node to a second node, the first node being associated to a first value and the second node being associated to a second value, a highness of an increasing function of: a distance between the first value and the second value, a distance between a first point, represented by the first node, and a medial geometrical element of the discrete representation, and a distance between a second point, represented by the second node, and the medial geometrical element.

The method may comprise one or more of the following:
- the Markov Random Field has target values representing a target distribution of the shape attribute, and the energy further penalizes, for each node, a highness of another increasing function of at least one distance between the value associated to the node and at least one target value;
- said another increasing function is an increasing function of:
  - a distance between the value associated to the node and a first target value; and
  - a distance between the value associated to the node and a second target value;
- the at least one target value comprises at least one value of the shape attribute computed geometrically at the respective point represented by the node, and/or at least one value of the shape attribute inferred by a neural network at the respective point represented by the node;
- said another increasing function also quantifies a correspondence between the values comprised in the at least one target value;
- said another increasing function is a function of a product between the correspondence and said at least one distance;
- the medial geometrical element is a medial axis of the discrete representation or a medial surface of the discrete representation;
- the discrete representation is a 3D point cloud;
- the discrete representation stems from photogrammetry and/or scan;
- the shape attribute is a normal, a curvature, or a type of primitive;
- the real object comprises at least one sharp feature; and/or
- the method further comprises segmenting the discrete representation based on the modified set of values.

It is further provided a computer program comprising instructions for performing the method.

It is further provided a computer readable storage medium having recorded thereon the computer program.

It is further provided a system comprising a processor coupled to a memory and a graphical user interface, the memory having recorded thereon the computer program.

BRIEF DESCRIPTION OF THE DRAWINGS

Embodiments will now be described, by way of non-limiting example, and in reference to the accompanying drawings, where.

DETAILED DESCRIPTION

Figure 1:
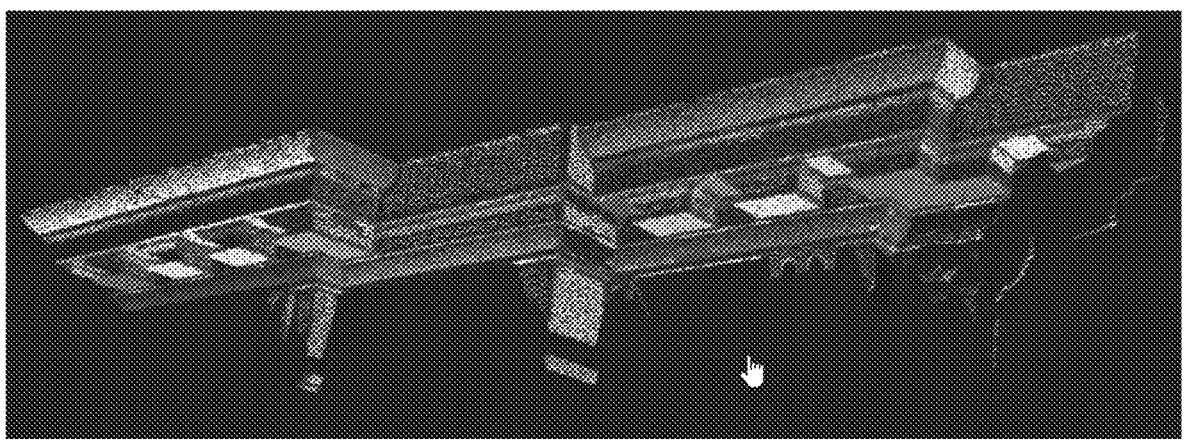
FIGS. 1, 2, 3, 4, 5, 6, 7 and 8 illustrate the method.

It is proposed a computer-implemented method for processing a 3D signal of a shape attribute over a real object. The method comprises providing a graph having nodes and arcs. Each node represents a respective point of a measured 3D discrete representation of the real object. Each arc connects two nodes representing neighboring points of the discrete representation. The method further comprises providing a set of values representing a distribution of the shape attribute over the real object. Each value is associated to a respective node of the graph and represents the shape attribute at the respective point represented by the respective node. The method further comprises modifying the set of values by minimizing an energy defined on a Markov Random Field formed on the graph. The energy penalizes, for each arc connecting a first node to a second node, the first node being associated to a first value and the second node being associated to a second value, a highness of an increasing function of: a distance between the first value and the second value, a distance between a first point, represented by the first node, and a medial geometrical element of the discrete representation, and a distance between a second point, represented by the second node, and the medial geometrical element.

This constitutes an improved method for processing a 3D signal of a shape attribute over a real object.

The method takes as input the set of values representing a distribution of the shape attribute over the real object. Each value is associated to a node of the graph, the node representing a respective point of a measured 3D discrete representation of the real object, and the value represents the shape attribute at the respective point. Thus, there is a measured 3D discrete representation of the real object and a set of values each representing (e.g. a value of) the shape attribute at a respective location of the measured 3D discrete representation. In other words, the set of values forms a 3D signal of the shape attribute, the 3D signal corresponding to (e.g. being computed from and/or being measured at the same time than) the measured 3D discrete representation, each value representing a measure of the shape attribute at a respective location of the measured 3D discrete representation. Said otherwise the 3D signal is a measure of the distribution of the shape attribute over the real object.

The 3D signal measuring the distribution of the shape attribute over the real object may be used (e.g. once processed according to the method) in many contexts, such as computer vision, 3D solid modeling (CAD) and/or 3D reconstruction. For example, it may be used in fields such as virtual and augmented reality, or any kind of immersive experience, video games and mechanical parts, building or any kind of object 3D reconstruction and modeling. The 3D signal may for example be used in a 3D solid modeling process and/or in a 3D reconstruction process, for example for segmenting the discrete representation based on the 3D signal. The segmenting may be followed by a 3D reconstruction process of the discrete representation (e.g. for example when the discrete representation is a 3D point cloud) and/or by the determining of a B-rep, of a CSG construction tree and/or of a feature tree representing the real object, as known per se from the fields of 3D reconstruction and of 3D solid modeling.

That said, the method modifies the set of values by minimizing the energy defined on the Markov Random Field (hereinafter sometimes referred to as "MRF") formed on the graph. The energy penalizes, for each arc connecting a first node, associated to a first value of the set, to a second node (i.e. a neighboring node of the first node) associated to a second value of the set, a highness of an increasing function of a distance between the first value and the second value. In other words, for each couple of neighboring points, the energy penalizes the disparity (e.g. discordance, discrepancy) between the values respectively representing the shape attribute at these neighboring points. In yet other words, the energy penalizes brutal local variations (e.g. sharp and/or non-smooth local variations) within the 3D signal of the shape attribute. Said otherwise, the energy penalizes non-smooth variations of the value of the shape attribute as measured over neighboring points of the 3D discrete representation. Thus, the result of the minimizing (i.e. the modified set of values) is a modified (thus processed) 3D signal of the shape attribute where at least a (e.g. strict) part of the brutal local variations are relatively smoothed (e.g. with respect to a convergence criterion of the MRF). Moreover, in the case of the method, and as further discussed hereinafter, too much smoothing of the local variations within the 3D signal of the shape attribute is avoided in areas where there exists sharp shape/geometric variations in the real world. These areas may be considered as areas where the smoothing may be counterproductive for the shape attribute values of interest. This is notably done by using the distance to the medial geometrical element, as further discussed hereinbelow. Incidentally, the MRF is a powerful tool, for which a certain number of efficient and fast solvers exist.

Now, the measured 3D discrete representation stems from measurements performed by one or more physical devices suitable for this task (such as sensors). Brutal local variations within the 3D signal of the shape attribute may typically represent noise within the 3D signal of the shape attribute, said noise resulting from the measurements. In examples, the discrete representation is noisy. By minimizing an energy that penalizes at least a part of these brutal local variations, the method modifies (e.g. iteratively) the set of values so that (e.g. until) the local variations within the 3D signal of the shape attribute are relatively smoothed (e.g. with respect to a convergence criterion of the MRF). In other words, the method denoises the 3D signal of the shape attribute.

Furthermore, the increasing function is as well an increasing function of: a distance between said first point and a medial geometrical element of the discrete representation, and a distance between said second point and the medial geometrical element. Now, a point for which the distance between the point and the medial geometrical element is small is a point corresponding to a sharp feature of the real object, e.g. a point located on a sharp feature of the real object or in the neighborhood of a sharp feature of the real object. Thus, when either said first point or said second point correspond to a sharp feature of the real object, the distance between this point and the medial geometrical element is relatively small (e.g. as compared to other distances between other points corresponding to smooth features of the real object and the medial geometrical element), and thus does not contribute much to the highness of the increasing function. Therefore the highness of the increasing function is less penalized when minimizing the energy, e.g. as compared to other couples of first and second points where both points correspond to a smooth feature of the real object. This is all the more true when both points correspond to a sharp feature.

Therefore, the minimizing of the energy certainly regularizes too strong local variations within the set of values, but much less smoothing happens around values corresponding to sharp features of the real object. In other words, the method denoises the 3D signal of the shape attribute of the real object but preserves variations within the 3D signal that do not correspond to noise, but that correspond to sharp features of the real object as it is in the real world. As a result, the processed 3D signal of the shape attribute (i.e. the modified set of values) represents accurately the distribution of the shape attribute over the real object. Said otherwise, real objects often comprise one or more sharp features, and the method allows to denoise the 3D signal while preserving variations in the signal that are due to the presence of these sharp features. In yet other words, in the real world the shape attribute varies very smoothly over smooth parts of the real object and more brutally in areas of the shape of the real object where sharp features are present, and the method processes the 3D signal of the shape attribute so that (e.g. until) it approaches the distribution of the shape attribute as it is in the real world, e.g. with respect to a convergence criterion (e.g. of the MRF). The method is thus accurate and provides a realistic denoising of the 3D signal.

The method is for processing a 3D signal of a shape attribute over a real object.

By "real object", it is meant any object of the real world. The real object is thus a three-dimensional solid (i.e. a 3D closed volume). In examples, the real object comprises at least one sharp feature. A sharp feature is a layout of material within the real object that has a sharp (i.e. non-smooth, non-regular) shape.

The real object may be a (e.g. mechanical) part or assembly of parts (or equivalently an assembly of parts, as the assembly of parts may be seen as a part itself from the point of view of the method, or the method may be applied independently to each part of the assembly), or more generally any rigid body assembly (e.g. a mobile mechanism). The real object may be any (e.g. manufacturing) product in various and unlimited industrial fields, including: aerospace, architecture, construction, consumer goods, high-tech devices, industrial equipment, transportation, marine, and/or offshore oil/gas production or transportation. The real object may thus represent an industrial product which may be any mechanical part, such as a part of a terrestrial vehicle (including e.g. car and light truck equipment, racing cars, motorcycles, truck and motor equipment, trucks and buses, trains), a part of an aerial vehicle (including e.g. airframe equipment, aerospace equipment, propulsion equipment, defense products, airline equipment, space equipment), a part of a naval vehicle (including e.g. navy equipment, commercial ships, offshore equipment, yachts and workboats, marine equipment), a general mechanical part (including e.g. industrial manufacturing machinery, heavy mobile machinery or equipment, installed equipment, industrial equipment product, fabricated metal product, tire manufacturing product), an electro-mechanical or electronic part (including e.g. consumer electronics, security and/or control and/or instrumentation products, computing and communication equipment, semiconductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging). All these objects often comprise one or more sharp feature.

By "shape attribute", it is meant any attribute that describes locally the shape of the real object. By "3D signal of the shape attribute over the real object", it is meant a measured distribution of the shape attribute over the real object, i.e. a measured field of values each representing a value of the shape attribute at a given location on the real object. By "measured distribution", it is meant that the distribution stems from physical measurements performed on the real object (e.g. by one or more physical sensors), the distribution being in examples directly measured and being in other examples computed from the physical measurements, e.g. by computations performed based on the measured points of the measured discrete representation. As said, the provided set of values forms a 3D signal of the shape attribute. The providing of the set of values may comprise measuring the set of values on the real object or computing the set of values based on (e.g. the measured points of) the measured discrete representation. The providing of the set of values is further discussed hereinafter.

As said, the shape attribute is an attribute describing locally the shape of the object. The shape attribute at a given location on the real object may be any set of one or more parameters and/or labels specifying characteristics of the local shape of the real object at the given location. The shape attribute may for example be a normal, i.e. a normal vector, e.g. with respect to an outer orientation of the real object. Alternatively, the shape attribute may be curvature, such as any curvature on a surface, for example a gaussian curvature, principal curvatures, or a mean curvature. Alternatively, the shape attribute may be a type of primitive, i.e. the shape attribute may describe locally the type of geometric primitive (e.g. a cube, a cylinder, a sphere, a cone, a pyramid, an ellipsoid or a torus) forming the local shape of the real object.

The providing of the graph and of the set of values is now discussed. Since the measured 3D discrete representation of the real object is involved in this providing, the measured 3D discrete representation of the real object is now discussed.

The 3D discrete representation of the real object is herein a data structure which comprises a discrete set of pieces of data. Each piece of data represents a respective geometrical entity (e.g. a point, a surface) of a 3D shape of the real object positioned in a 3D space. Each geometrical entity represents a respective location of the 3D shape (in other words, a respective portion of material constitutive of a solid represented by the 3D shape). The aggregation (i.e. union or juxtaposition) of the geometrical entities represents altogether the 3D shape. Any discrete geometrical representation herein may in examples comprise a number of such pieces of data higher than 100 (e.g. higher than 1000).

The 3D discrete representation of the real object is in examples a 3D point cloud, each geometrical entity being a point. The 3D discrete representation of the real object is in other examples a 3D mesh, each geometrical entity being a mesh tile or face. Any 3D mesh herein may be regular or irregular (i.e. consisting or not of faces of a same type). Any 3D mesh herein may be a polygonal mesh, for example a triangular mesh. Any 3D mesh herein may alternatively be a B-Rep. Any 3D mesh herein may be obtained from a 3D point cloud, for example by triangulating the 3D point cloud (e.g. with a 3D Delaunay triangulation and a method to extract relevant facets).

By "measured", it is meant that the 3D discrete representation of the real object stems from (i.e. is determined from) physical measurements on the real object, for example within a 3D reconstruction process. The 3D reconstruction process may comprise providing the real object, providing one or more physical sensors each configured for acquiring a respective physical signal, and acquiring the one or more respective physical signals by operating the one or more physical sensors on the real object (i.e. scanning the real object with each sensor). The 3D reconstruction may then automatically determine a 3D point cloud and/or a 3D mesh based on the measurements, according to any known technique. The one or more sensors may comprise one or more portable tray scans. The one or more sensors may additionally or alternatively comprise one or more metrology scans.

The method may notably comprise providing the measured 3D discrete representation, e.g. before the providing of the graph and of the set of values. Providing the 3D discrete representation may comprise performing the previously discussed physical measurements on the real object, for example by performing the previously discussed 3D reconstruction process. Alternatively, the providing of the measured 3D discrete representation may comprise retrieving the 3D discrete representation from a (e.g. distant) memory where it has been stored subsequent to its acquisition by performing physical measurements, as previously discussed.

The providing of the graph is now discussed.

Be it a 3D mesh or a 3D point cloud, the measured 3D discrete representation of the real object has points each representing a given location on the real object. The graph captures the topology of the real object as represented by the discrete representation by having nodes each representing a respective point of the 3D discrete representation and arcs each connecting neighboring points of the discrete representation. By "the topology of the real object", it is meant "the topology in terms of the 3D discrete representation of the real object", which is for example different of the topology in terms of a B-rep representation. The neighboring points (also referred to as "neighbors") of a point are the points which are the closest to the point, e.g. with respect to a given distance (such as any known distance in 3D). For example, the neighboring points of the point may be the points of which distance to the point are lower than a predefined threshold. The threshold may depend in the set of values provided as input. For example, the threshold may depend on whether the provided set of values stems from a lidar of from a scan of a small mechanical part. The threshold may in fact depend on the specific case and on the acquisition method of the set of values. The threshold may be related to the densities of the measures (of the points) provided by the acquisition method. A first point and a second point are neighboring points when the first point belongs to the neighboring points of the second point, which implies that the second point belongs to the neighboring point of the first point.

The providing of the graph may comprise building the graph. Alternatively, the providing of the graph may comprise retrieving the graph from a (e.g. distant) memory where the graph has been stored after being built. Building the graph may comprise attributing a respective node to each point of the discrete representation. Building the graph may then comprise searching for each couple of neighboring points in the discrete representation. Building the graph may then comprise connecting the nodes of the graph respectively representing the points of the couple by an arc in the graph.

In examples, the discrete representation is a 3D mesh, having vertices, edges and faces or mesh tiles. In these examples, "two neighboring points" may stand for two vertices sharing an edge (i.e. connected by the edge) and building the graph may comprise creating an arc connecting the nodes representing respectively the two vertices, and this for every couple of neighboring points. In other words, an arc in the graph corresponds in this case to an edge in the 3D mesh shared by two vertices, and the arc connects two nodes representing the vertices.

In other examples, the discrete representation is a 3D point cloud. In these examples, the building of the graph may comprise, for each point of the 3D point cloud, finding the neighbors of the point and creating arcs between the point and at least some of the founded neighbors. Finding the neighbors may comprise using any known method suitable for finding neighboring points of a point in a 3D point could, such as a Nearest Neighbor Search algorithm. In these examples where the discrete representation is a 3D point cloud, the building of the graph may be carried out by using any known method suitable for building a graph having nodes and arcs, where each node represents a respective point of the 3D point cloud, and where each arc connects two nodes representing neighboring points of the 3D point cloud. For example, the building of the graph may be carried out by using the method described in Junjie Cao & al: Point Cloud Skeletons via Laplacian-Based Contraction (2010), which is incorporated herein by reference.

In examples of examples where the discrete representation is a 3D point cloud, the building of the graph may comprise connecting the points with some of their neighbors. The building may comprise, for each point, estimating its tangent plane and then projecting the point's neighbors in that plane. Then the building may comprise determining a 2D Delaunay triangulation of the projected points, yielding a reduced flat mesh comprising the point and the projections of its neighbors. The building may comprise using that mesh to decide to which neighbors the point is to be connected. Specifically, the building may then comprise connecting the node associated to the points to graph nodes associated with the points of the point cloud that did contribute projections in the tangent plane and that did end up being connected to the point in the 2D mesh built in the tangent plane via the 2D Delaunay triangulation. This method may be performed in another context in (Junjie Cao & al: Point Cloud Skeletons via Laplacian-Based Contraction (2010), which is incorporated herein by reference).

The providing of the set of values is now discussed.

The set of values represents a measured distribution of the shape attribute over the real object. As previously said, this means that each value of the set of value represents the shape attribute at a respective location of the discrete representation. In other words the value is a value of the shape attribute at the respective location of the discrete representation. The values of the set of values may be scalar values, vectoral values, or label values. In examples, the MRF works on labels. In such a case, the method may comprise reducing, by quantization, the values of the set of values to labels if the values are scalar or vectoral values. If the values are vectoral values, the minimizing may be carried out a number of times which equals the dimension of the corresponding vector space.

The providing of the set of values may comprise computing the set of values from the 3D discrete representation, the computing being carried out by any suitable method. Computing the set of values may be performed based on the discrete representation, e.g. based on the points of the discrete representation. For example, the computing of the set of values may comprise, for each point of at least a part of (e.g. all of) the discrete representation, computing the value of the shape attribute at the point based on the point and/or neighboring points of the point.

The computing of the value may be done geometrically, i.e. by one or more known geometric methods. Such a method computes the value by only relying on geometry, e.g. by computing one or more geometric formulae and/or by solving one or more geometric problems. For example, the computing of the value may comprise one or more of the followings:

- Fitting a plane to a set of points made of the point and its neighboring points and using the normal of the plan as the value;
- Computing as the value a curvature at the point by applying, to the points and its neighbors (computed as previously described), the well-known cotangent method for computing the curvature on a point of the 3D representation; and/or
- Fitting a primitive such as an ellipsoid to a set of points made of the point and its neighboring points and computing the normal at the point and the principal curvatures at the point based on the fitted primitive.

Alternatively, the value may be inferred by any known neural network learnt for inferring the value of the shape attribute on any point of the discrete representation based on the point and/or neighboring points of the point. In examples, the neural network may be the PCPNet, learned by a supervised learning based on a dataset of examples of 3D point clouds for which the "terrain truth" for the values of the shape attribute is known.

Alternatively, the providing may comprise measuring the set of values on the real object, e.g. when providing the 3D discrete representation by physical measurements as previously discussed. In both cases, the set of values forms the 3D signal of the shape attribute over the real object.

Alternatively, the providing of the set of values may comprise retrieving the set of values from a (e.g. distant) memory where it has been stored, e.g. subsequent to its computing or to its measuring, the set of values still forming the 3D signal of the shape attribute over the real object.

The minimizing of the energy is now discussed. Prior to that, Markov Random Field concepts are now briefly discussed.

As widely known, Markov Random Fields are tools used to infer the most likely configuration of labels (or discrete values) given probability distribution of those labels (or discrete values) on a graph by minimizing an energy with a smoothing term (also referred to as "smoothness term") and a cost term (and optionally a regularization term). As such, they are good tools to smooth away in the results of computations some defects that may have been induced by excessive noise in the inputs of the computations. As known per se, behind Markov Random Fields lies the idea that any problem can be modeled by the probability of a node of a graph to belong to a specific class (a target class) and a probability for that node to belong to a different class than its neighbors can be modeled by minimizing an energy of the type:

$$\sum_{p \text{ node}} E_{target}(p) + \gamma \sum_{p,q \text{ neighbors}} E_{diff}(p, q). \quad (1)$$

To that aim, the energy comprises a cost term (first sum in formula (1)), capturing, for each node, the probability of the node to belong to a specific class (a target class), and a smoothness term (second sum in the formula (1)), capturing for each couple of neighboring nodes, the probability of these nodes to belong to different classes. The scalar $\gamma$ determines the amount of the contribution of the smoothness term in the energy: the larger $\gamma$ is, the more the smoothness contributes to the energy. The scalar $\gamma$ is positive and smaller than a predefined number, for example 1. The energy minimized by the method is of the type (1). In examples of the method, $\gamma$ equals 1.

In the case of the method, the problem to be modeled may be described as follows: there is a measured 3D discrete representation of the real object, the discrete representation having points, and a set of values representing a distribution of the shape attribute over the real object, each value representing a value of the shape attribute at a respective point of the discrete representation. The aim of the minimizing is to modify the set of values so that: 1) the set of values stays close to the set of values as provided (i.e. there is not too much modifying of the 3D signal of the shape attribute as measured/computed from the discrete representation), and 2) local strong variations within the set of values, i.e. strong variations of values representing the shape attribute at neighboring points of the discrete representation, are smoothed away except in areas of the discrete representation that represent sharp features of the 3D discrete representation. To that aim, the method modifies the set of values by minimizing an energy defined on a Random Markov Field formed on the provided graph, the energy having a cost term capturing the aim 1) and a smoothness term capturing the aim 2). The cost term of the energy may be any known cost term able to capture the aim 1). The smoothness term is now discussed.

The energy penalizes, for each arc connecting a first node to a second node, the first node being associated to a first value and the second node being associated to a second value, a highness of an increasing function. The first value thus represents the shape attribute at the first point represented by the first node, and the second values thus represents the shape attribute at the second point represented by the second node. Also, the first point and the second point are neighboring points, as their representative nodes are connected by an arc in the graph. The smoothness term of the energy carries out the penalizing of the highness of the increasing function. In other words, for each couple of neighboring points represented by first and second nodes, the smoothness term penalizes the highness of the increasing function. By "penalizing the highness of the increasing function", it is meant that the energy quantifies, for each couple of neighboring points represented by first and second nodes, the highness of the increasing function (e.g. a highness of a value of the function), and that, during the minimizing, values representing the shape attribute at said neighboring points of the couple are modified if they are such that the increasing function is too large (i.e. has a too large value). They are modified such that the increasing function is smaller. The increasing function is now discussed.

The increasing function is an increasing function of a distance between the first value and the second value. The distance may be any distance between values, such as any distance in one dimension or in higher dimensions. Therefore, if the first and the second value, which, as said, represent the values of the shape attribute at two neighboring points, are too different from one another, the distance between them is large. In such a case, the increasing function tends to be large. By this it is meant that the large distance contributes to enlarging the value of the function, but, as the function depends on other parameters, the value of the function may still be relatively small, as discussed hereinafter.

As a matter of fact, the function is as well an increasing function of a distance between the first point (of the couple of neighboring points represented by the first and second nodes) and a medial geometrical element of the discrete representation. The medial geometrical element may be any medial geometrical element of the discrete representation. In examples, the medial geometrical element is a medial axis of the discrete representation or a medial surface of the discrete representation. The distance between the first point and the medial geometrical element may be any distance between the first point and the medial geometrical element, such as a Euclidean distance between the first point and the medial geometrical element. This distance may also be referred to as a Local Feature Size value (also referred to as "LFS value") of the first point.

Similarly, the function is as well an increasing function of a distance between the second point (of the couple of neighboring points represented by the first and second nodes) and a medial geometrical element of the discrete representation. The distance between the second point and the medial geometrical element may be any distance between the second point and the medial geometrical element, such as a Euclidean distance between the second point and the medial geometrical element. This distance may also be referred to as a Local Feature Size value (also referred to as "LFS value") of the second point.

More generally, the LFS value of a point of the discrete representation is the distance between the point and the medial geometrical element.

A small value of the distance between the first point and the medial geometrical element, e.g. as compared to other values of other distances between other points and the geometrical element, is representative of the fact that the first point corresponds to a location of the real object belonging to a sharp part of the shape of the real object. In such a case, the distance between the first point and the medial geometrical element does not contribute much to enlarging the value of the function, and to the contrary, contributes to diminishing it. Similarly, a small value of the distance between the second point and the medial geometrical element, e.g. as compared to other values of other distances between the other points and the geometrical element, is representative of the fact that the second point corresponds to a location of the real object belonging to a sharp part of the shape of the real object. In such a case, the distance between the second point and the medial geometrical element does not contribute much to enlarging the value of the function, and to the contrary, contributes to diminishing it.

Therefore, the following can be said. If both the first point and the second point belong to a smooth part of the shape of the real object, their LFS values are large. In such a case, the highness of the increasing function mainly depends on the highness of the distance between the first value and the second value. Should this distance be large, it indicates a strong variation between the first value and the second value, where in reality there should be none, because the first and second points both belong to a smooth part of the shape of the real object. Therefore, this strong variation corresponds to a noise, as previously discussed, and consequently, the minimizing will modify the first value and/or the second value so that the distance between them becomes smaller (e.g. with respect to a convergence criterion of the MRF). In other words, where real values of the shape attribute for neighboring points are close because the neighboring points belong to a smooth part of the shape of the real object, the minimizing tends to ensure that the corresponding values in the set of values are and/or remain close as well. In yet other words, strong shape attribute local variations within the 3D signal are smoothed away when they correspond to a noise.

Now, if the first (resp. second) point belongs to a sharp part of the shape of the real object, its LFS value is small. In such a case, this LFS value contributes to diminishing the value of the increasing function. Therefore, the value of the increasing function will be less penalized during the minimizing, even if the distance between the first and the second value is large. Should now the LFS value of the second (resp. first) point be small as well, meaning that the second (resp. first) point belongs to a sharp part of the shape of the real object, the value of the increasing function will be even less penalized during the minimizing, even if the distance between the first and the second value is large. Therefore, strong variations between the values of two neighboring points tend to be preserved (or at least, not to be much smoothed) during the minimizing when at least one of the neighboring points belongs to a sharp part of the shape, and tend to be even more preserved (or at least, less smoothed) during the minimizing when both neighboring points belongs to a sharp part of the shape. In other words, where real values of the shape attribute for neighboring points are strongly different because at least one of (e.g. both of) the neighboring points belong(s) to a sharp part of the shape of the real object, the minimizing tends to ensure that the corresponding values in the set of values are strongly different as well. In yet other words, strong shape attribute local variations within the 3D signal tend to be preserved when they correspond to a sharp feature of the real object.

Therefore, the method allows denoising of the 3D signal while preserving strong local variations of the shape attribute within it when these strong variations correspond to sharp features of the real object in the real world.

The LFS values are now further discussed.

The LFS values and the medial geometrical element are well known concepts and may be computed by any known method or combinations of known methods. Some of these methods are disclosed in Amenta & al., *Surface Reconstruction by Voronoi Filtering* (1999), in Andrea Tagliasacchi & al, *3D Skeleton: A State-of-the-Art Report,* DOI: 10.1111/cgf.12865, EUROGRAPHICS 2016, in Daniel Rebain & al, *LSMAT Least Squares Medial Axis Transform,* DOI: 10.1111/cgf.13599 and in Thomas Delame & al., *Structuring 3D Medial Skeletons: A Comparative Study. Symposium on Vision,* Modeling and Visualization, October 2016, Bayreuth, Germany. pp. 1-8, 10.2312/vmv.20161336, hal-01359738, which are each incorporated herein by reference. The method may comprise computing, by any known method, the LFS values of the points of the discrete representation, e.g. before the modifying of the set of values. The method may additionally comprise computing, by any known method, the medial geometrical element, e.g. before the computing of the LFS values.

The computing of the LFS values and/or of the medial geometrical element is based on the 3D discrete representation. In examples, this means that the computing of the LFS values and/or of the medial geometrical element takes as input (e.g. the points of) the discrete representation and, according to any suitable known method (such as the ones previously discussed), outputs the LFS values and/or the medial geometrical element. In yet other examples, the computing of the LFS values and/or of the medial geometrical element comprises denoising (e.g. smoothing, e.g. regularizing) the discrete representation and computing then the LFS values and/or of the medial geometrical element based on the denoised discrete representation. By this, it is meant that the computing of the LFS values and/or of the medial geometrical element takes as input (e.g. the points of) the denoised discrete representation and, according to any suitable known method (such as the ones previously discussed), outputs the LFS values and/or the medial geometrical element. It is to be understood that in those examples where the computing of the LFS values and/or of the medial geometrical element comprises denoising the discrete representation, the minimizing of the energy is still performed based on the not-denoised discrete representation. Denoising the discrete representation before computing the LFS values and/or the medial geometrical element allows computing of the LFS values and/or the medial geometrical element with more accuracy. Still performing the minimizing based on the not-denoised discrete representation allows to denoise the 3D signal of the shape attribute while preserving sharp features, as previously discussed, with more accuracy, because the LFS values and/or the medial geometrical element used in the minimizing are/is computed with more accuracy. Alternatively, the method may compute the LFS values without smoothing/denoising the discrete representation first. This is notably the case when the computing of the LFS values is performed according to the previously cited LSMAT method.

The minimizing of the energy is now further discussed.

The minimizing may be carried out by any known algorithm suitable for performing the minimizing, such as any known Markov Random Field solver. Markov Random Fields can be solved via alpha expansion Graph Cut and solutions exist to exploit parallelism with modern hardware like in D. Thuerck & al: *A Fast, Massively Parallel Solver for Large*, which is incorporated herein by reference. The concept of minimizing an energy defined on a Markov Random Field formed by a graph, algorithms thereof, are in fact well-known from the field of Markov Random Fields and are not further discussed.

The smoothness term is now further discussed.

In examples, the smoothness term may be a sum over all arcs in the graph of terms of the type:

$$E_{diff}(p, q) = \frac{LFS_p \times LFS_q}{maxLFS \times maxLFS} \times |p - q|,$$

where (p,q) is the couple made of the first value p (associated to the first point) and of the second value q (associated to the second point), where |p–q| is the distance between the first value and the second value, where $LFS_p$ is the LFS value of the first point, where $LFS_q$ is the LFS value of the second point, and where maxLFS is the maximum over all LFS values of the points of the discrete representation.

In other examples, the smoothness term may be a sum over all arcs in the graph of terms of the type:

$$E_{diff}(p, q) = \frac{(LFS_p - minLFS) \times (LFS_q - minLFS)}{maxLFS \times maxLFS} \times |p - q|,$$

where (p,q) is the couple made of the first value p (associated to the first point) and of the second value q (associated to the second point), where |p–q| is the distance between the first value and the second value, where $LFS_p$ is the LFS value of the first point, where $LFS_q$ is the LFS value of the second point, where maxLFS is the maximum over all LFS values of the points of the discrete representation, and where minLFS is the minimum over all LES values of the points of the discrete representation.

The cost term is now further discussed.

As previously discussed, the cost term captures the requirement for the set of values being modified to stay close to the set of values as provided. In other words, while the smoothness term tends to modify (when minimizing the energy) the set of values so that local brutal variations are smoothed away except in areas of the discrete representation corresponding to sharp features, the cost term tends to ensure (when minimizing the energy) that the modified set of values stays close to the set of values as provided. As said, the cost term can be any known cost term ensuring that the set of values being modified during the minimizing stays close to the set of values as provided.

In examples, the Markov Random Field has target values representing a target distribution of the shape attribute. In these examples, the energy further penalizes, for each node, a highness of another increasing function of at least one distance between the value associated to the node and at least one target value.

In these examples, the target values form one or more sets of target values each representing a target distribution of the shape attribute. In other words, the minimizing of the energy is such that the set of values tends to be modified so as to be close to (e.g. so as to converge towards) the one or more sets of target values, i.e. such that the set of values tends to be modified to become relatively close to each set of the one or more sets of target values. Each set of target values may be any set of values representing a distribution of the shape attribute which is similar to the distribution of the shape attribute represented by the provided set of values. For example, the values of the set of target values may be representative of the values of the provided set of values. Additionally or alternatively, the values of the set of target values may be computed from the discrete representation. In such a case, the method may comprise the computing, for each respective set of target values of the one or more sets of target values, values of the respective set of target values from the discrete representation, e.g. before the minimizing. The computing may be carried out by a respective different method for each respective set of target values. Additionally or alternatively, the method may comprise sampling the target values of each one of said sets into values representative of the values of the provided set of values. The values of each set of target values may be scalar values, vectoral values, or label values.

The computing of the target values of each one of said set of target values may be performed based on the discrete representation, e.g. based on the points of the discrete representation. For example, the computing of the target values of the set may comprise, for each point of at least a part of (e.g. all of) the discrete representation, computing the value of the shape attribute at the point based on the point and/or neighboring points of the point. The computing of the value may be done geometrically, i.e. by one or more known geometric methods. Such a method computes the value by only relying on geometry, e.g. by computing one or more geometric formulae and/or by solving one or more geometric problems. For example, the computing of the value may comprise one or more of the followings:

Fitting a plan to a set of points made of the point and its neighboring points and using the normal of the plan as the value;

Computing as the value a curvature at the point by applying, to the points and its neighbors (computed as previously described), the well-known cotangent method for computing the curvature on a point of the 3D representation; and/or Fitting a primitive such as an ellipsoid to a set of points made of the point and its neighboring points and computing the normal at the point or the principal curvatures at the point based on the fitted primitive.

Alternatively, the value may be inferred by any known neural network learnt for inferring the value of the shape attribute on any point of the discrete representation based on the point and/or neighboring points of the point.

Still in these examples, the energy further penalizes, for each node, a highness of another increasing function of at least one distance between the value associated to the node and at least one target value. The cost term of the energy carries out the penalizing of the highness of the increasing function. In other words, for each node of the graph, the cost term penalizes the highness of the another increasing function. By "penalizing the highness of the another increasing function", it is meant that the energy quantifies, for each node, the highness of the another increasing function (e.g. a highness of a value of the another increasing function), and that, during the minimizing, the value representing the shape attribute at the point represented by the node is modified if it is such that the another increasing function is too large (i.e. has a too large value). It is modified such that the another increasing function is smaller. The another increasing function is now discussed.

Said another increasing function is a function of at least one distance between the value associated to the node and at least one target value. This means that the another increasing function is a function of one or more distances, each between the value associated to the node and a respective target value (e.g. belonging to a respective set of said one or more sets of target values). Each respective one of the one or more distances may be any distance between values, such as any distance in one dimension or in higher dimensions. Therefore, for each distance of said one or more distances, if the value associated to the node and said respective target value are too different from one another, the distance between them is large. In such a case, said another increasing function gets large as well. Consequently, the value associated to the node will be modified during the minimizing, so as to diminish the value of the another increasing function. This tends to ensure that the modified set of values stays close to the provided set of values during the minimizing, because disparity (e.g. discrepancy, discordance) between the modified set of values and the target values is penalized as it contributes to increase the another increasing function.

In examples, the at least one distance consists in one single distance. In other words, the target values form a single set of target values representative of the provided set of values, as previously discussed, and the cost terms penalized, for each node, said another increasing function of said single distance between the value associated to the node and a target value of the single set of target values. In examples of these examples, the cost term may be a sum over all nodes of the graph of terms of the type:

$$E_{target}(p)=|p-\text{target}|$$

where p is the value associated to the node, where |p−target| is the single distance between the value associated to the node and the target value, and where target is the target value.

In other examples, said another increasing function is an increasing function of: a distance between the value associated to the node and a first target value and a distance between the value associated to the node and a second target value.

Such examples are now discussed.

In these examples, the target values form a first set of target values, made of first target values, and a second set of target values, made of second target values. Both the first set and second set of target values are made of values representative of the provided set of values, as previously discussed. In these examples, the at least one distance comprise (e.g. consist in) a first distance and a second distance. Said another increasing function is in other words a function of the first distance between the value associated to the node and the first target value (i.e. belonging to the first set of target values), and of the second distance between the value associated to the node and the second target value (i.e. belonging to the second set of target values). Therefore, as previously said, the cost term penalizes, during the minimizing, disparity (e.g. discrepancy, discordance) between the modified set of values and each one of the first set and second set of target values. In other words, the minimizing of the energy tends to measure whether the provided set of values, when being modified, remains close to both the first set and second set of target values, and to modify values of the provided set of values being modified when they become too discordant with values of either the first set or second set of target values. In yet other words, the cost term ensures that the modified set of values tends to remain close to two sets both representative of the provided set of values. This amounts to say that the cost term penalizes, during the minimizing, disparity between the modified set of values and two different sets of values, yet both representative of the provided set of values. This strengthens the manner with which the method ensures that the modified set of values and the provided set of values remain close, as the method tends to ensure closeness to two different sets of target values yet both representative of the provided set of values. This further improves the accuracy of the method.

In examples, the at least one target value comprises at least one value of the shape attribute computed geometrically at the respective point represented by the node, and/or at least one value of the shape attribute inferred by a neural network at the respective point represented by the node.

By "at least one value of the shape attribute computed geometrically", it is meant at least one value of the shape attribute computed by one or more geometric methods suitable for computing values of the shape attribute. As said, the method may comprise the computing of the target values, which may comprise, for each said at least one target value, computing geometrically at least one value of the shape attribute at the respective point represented by the node, as previously discussed.

By "at least one value of the shape attribute inferred by a neural network", it is meant at least one value of the shape attribute yielded by a neural network learnt for computing values of the shape attribute. The neural network may be any neural network learnt for computing values of the shape attribute. As said, the method may comprise the computing of the target values, which may comprise, for each said at least one target value, computing, by applying the neural network, at least one value of the shape attribute at the respective point represented by the node, as previously discussed.

The method may thus use, as target values, values computed geometrically and/or values inferred by a neural network. This makes the method flexible, as the method may rely on at least two different methods of computing the target values, and thus may benefit from advantages yielded by at least one of these two methods, such as accuracy, speed and/or robustness. The method may further combine these advantages.

In examples, the at least one target value comprises at least one value of the shape attribute computed geometrically at the respective point represented by the node, and at least one value of the shape attribute inferred by a neural network at the respective point represented by the node. In these examples, the method uses, as target values, values that stem from the fusion of values computed geometrically and of values inferred by the neural network. This promotes closeness (e.g. convergence) of the modified set of values to values that are considered more reliable than others (values for which geometric methods and the neural network provide similar estimates), which improves accuracy of the method.

In examples where said another increasing function is an increasing function of a distance (a first distance, as previously discussed) between the value associated to the node and a first target value and a distance (a second distance, as previously discussed) between the value associated to the node and a second target value, the at least one target value may comprise at least one value of the shape attribute computed geometrically at the respective point represented by the node, and at least one value of the shape attribute inferred by a neural network at the respective point represented by the node. Specifically, in such a case, the first target value is the at least one value of the shape attribute computed geometrically at the respective point represented by the node and the second target value is the at least one value of the shape attribute inferred by a neural network at the respective point represented by the node.

In examples, said another increasing function also quantifies a correspondence between the values comprised in the at least one target value. These examples are now discussed.

As previously said, the target values may form one or more sets of target values. Said another increasing function may be an increasing function of one or more distances each between the value associated to the node and a respective target value, belonging to a respective one of the one or more set of target values. Each said respective target value represents a value of the shape attribute at the location of the discrete representation which corresponds to the point represented by the node. Now, by the correspondence is a term or a quantity which quantifies a correspondence (e.g. a similarity, e.g. a substantial equality) between each said respective target value. The term may be a term which is large when said respective target values correspond to each other, e.g. are similar, e.g. are equal or substantially equal, and which is small when said target values do not correspond to each other, e.g. are too different or substantially too different. Thereby the distances to target values have all the more an impact when minimizing the energy. Additionally or alternatively, the term may be a term which is non-zero when said respective target values correspond to each other, e.g. are similar, e.g. are equal or substantially equal, and which is null when said target values do not correspond to each other, e.g. are too different or substantially too different. In such a case, it may be said that the energy captures the consideration that it is less serious to move away from the target values, which do not agree with each other anyway. The term may depend on said respective target values and may quantify the correspondence between said respective target values directly based on said respective target values. Alternatively, the term may depend on other values and may quantify the correspondence between said respective target values based on said other values.

Quantifying a correspondence between the values comprised in the at least one target value improves robustness and accuracy of the method. Indeed, when the values comprised in the at least one target value do not correspond, the value of said another increasing function tends to decrease. Therefore, even if at least one target value comprised in the at least one target value is such that said at least one distance is large, said another increasing function does not necessarily tend to be accordingly large, because the lack of correspondence between the values comprised in the at least one target value tends to diminish the value of the function. The cost term tends thereby to give more strength to target values, comprised in the at least one target values, which correspond to each other. In other words, the minimizing tends to modify the set of values so that it remains close to these strong target values (those to which more strength is given as said above). Now, each one of these strong target values represents relatively accurately the shape attribute at a location of the discrete representation, because the target values comprised in the strong target values correspond to each other, even if they are computed differently, e.g. at least one geometrically and at least one inferred by a neural network. In other words, the cost term promotes closeness (e.g. convergence, e.g. relative to a convergence criterion of the MRF), during the minimizing, of the modified set of values to a set of target values representing well the values of the provided set of values.

In examples, said another increasing function is a function of a product between the correspondence and said at least one distance. This is a particularly simple, robust and efficient way of giving more strength to target values comprises in said at least one target value and which correspond to each other. Indeed, should the correspondence be small (e.g. null), the product tends to be as well, and the function tends to be as well. Thus, less penalizing of the value of the function is done during the minimizing, even if said least one distance between said value associated to the node and a value of said least one target value should be large.

Further examples of the method are now discussed.

In these examples, said another increasing function is an increasing function of a first distance between the value associated to the node and a first target value, and of a second distance between the value associated to the node and a second target value. In these examples, the first target value is a value of the shape attribute computed geometrically at the respective point represented by the node and the second target value is a value of the shape attribute inferred by a neural network at the respective point represented by the node. In these examples, said another increasing function also quantifies a correspondence between the first target value and the second target value.

In these examples, the cost term tends to ensure that the set of values being modified during the minimizing remains close to both the first target values, computed geometrically, and the second target values, inferred by a neural network. Both the first target values and the second target values represent a distribution of the shape attribute over the real object that is similar to the one represented by the provided set of values. In other words, the MRF optimization according to the method uses as target values a fusion of target values computed geometrically and of target values inferred by a neural network. This improves robustness and accuracy of the method, as at least two different types of target values, i.e. coming from two different computation sources, are used to keep the modified set of values close to the provided set of values. Furthermore, the method gives more strength to the target values for which the two sources agree, i.e. yield similar values. This allows benefit from advantages in accuracy of both methods and further improves robustness and accuracy of the method. In these examples, said another increasing function may be a function of a product between the correspondence, the distance between the value associated to the node and the first target value and the distance between the value associated to the node and the second target value. As previously said, this further improves simplicity and robustness of the method.

In these examples, the cost term may be a sum over all nodes in the graph of terms of the type:

$$E_{target}(p) = (\text{geomNormal} \cdot \text{neuralNormal}) \times \frac{1}{2}(|p - \text{geomTarget}| + |p - \text{neuralTarget}|)$$

where p is the value associated to the node, geomTarget is the first target value and is computed geometrically, neuralTarget is the second target value and is inferred by a neural network, geomNormal is a normal computed geometrically at the point represented by the node, and neuralNormal is a normal inferred by the neural network at the point represented by the node. |p−geomTarget| is the distance between the value associated to the node and the first target value. |p−neuralTarget| is the distance between the value associated to the node and the second target value. geomNormal.neuralNormal is the correspondence between the first target value and the second target value. Here the shape attribute is a normal or any shape attribute closely related to the normal, e.g. computed based on the normal, such as a maximal curvature.

Still in these examples, the cost term may alternatively be a sum over all nodes in the graph of terms of the type:

$$E_{target}(p) = \max_i(\text{geomValueGaussian}(i) \times \text{neuralValueGaussian}(i)) \times \frac{1}{2}(|p - \text{geomTarget}| + |p - \text{neuralTarget}|),$$

where p is the value associated to the node, geomTarget is the first target value and is computed geometrically, neuralTarget is the second target value and is inferred by a neural network, geomValueGaussian is a gaussian distribution, centered around geomTarget, of values each representing the shape attribute and each computed geometrically at the point represented by the node, and neuralValueGaussian is a gaussian distribution, centered around neuralTarget, of values each representing the shape attribute and each inferred by the neural network at the point represented by the node. (i) is the bucket index of a histogram covering the range of values of the provided set of values. |p−geomTarget| is the distance between the value associated to the node and the first target value. |p−neuralTarget| is the distance between the value associated to the node and the second target value.

$$\max_i(\text{geomValueGaussian}(i) \times \text{neuralGaussian}(i))$$

is the correspondence between the first target value and the second target value. Here the shape attribute can be any shape attribute, for example any shape attribute, which is not related to a normal.

The method may be applied in computer vision, 3D solid modeling (CAD) and/or 3D reconstruction. For example the method may be applied in fields such as virtual and augmented reality, or any kind of immersive experience, video games and mechanical parts, building or any kind of object 3D reconstruction and modeling. The method may for example be included in a 3D solid modeling process and/or in a 3D reconstruction process.

The method may for example further comprise segmenting the discrete representation based on the modified set of values. Segmenting the discrete representation consists in partitioning (e.g. decomposing, clustering) the discrete representation into smaller and meaningful discrete sub-representations. The partitioning is based on a set of values of a shape attribute over the discrete representation, which is the modified set of values in case of the method. The segmenting according to the method may be done by any known segmenting method, which are well known and not further discussed herein. The segmenting is improved as the modified set of values represents relatively accurately the distribution of the shape attribute over the real object as it is in the real world. The segmenting may be followed by a 3D reconstruction process of the discrete representation (e.g. for example when the discrete representation is a 3D point cloud) and/or by the determining of a B-rep, of a CSG construction tree and/or of a feature tree representing the real object, as known per se from the fields of 3D reconstruction and of 3D solid modeling.

An implementation of the method is now discussed.

This implementation may be applied in the fields of Computer Vision, 3D solid modelling (CAD) and 3D Reconstruction. This implementation may thus be useful to fields such as virtual and augmented reality (more generally, any kind of immersive experience), video games and mechanical parts, building or any kind of object 3D reconstruction and modelling.

Evaluating local quantities or characteristics on noisy point cloud and meshes is a complex task. This implementation helps to improve the quality of the results for noisy inputs. This implementation relatively preserves detailed characteristics in areas of a shape where sharp features are present.

Markov Random Fields (MRF) are known tools used to infer the most likely configuration of labels (or discrete values) given probability distribution of those labels (or discrete values) on a graph by minimizing an energy with a smoothing term and a cost term (and often a regularization term). This implementation comprises a formulation of the MRF energy that uses the local feature size in the smoothing term. With noisy input the local feature size itself might be noisy. In those cases the local feature size can be computed on a smoothed variation of the point cloud. Even if the smoothing is a bit strong and does not preserve the sharp geometric features of the inputs, this implementation still provides good results as it uses it only to identify areas where it is worth to smooth and areas where it is riskier to do so. Alternatively, the local feature size may be computed by a method (such as the previously cited LSMAT method) which does not require a smoothed variation of the point cloud. Additionally, the cost term can use values computed via purely geometric methods as well as values inferred by a neural network in a way that gives more strength to values for which both methods tend to agree on similar estimates and realize a fusion of the two estimates. Markov Random Fields can be solved via alpha expansion Graph Cut and solutions exist to exploit parallelism with modern hardware like in D. Thuerck & al: *A Fast, Massively Parallel Solver for Large*, which is incorporated herein by reference. In this implementation, any Markov Random Field solver can be used, but preferably the ones that can work on several hundreds of thousands of nodes with thousands of labels/values are used.

With this implementation's formulation of the smoothing term based on the Local Feature Size, this implementation allows to not smooth excessively in areas where sharp geometric features are present. As such it becomes a convenient tool to smooth values that are not expected to vary smoothly away from sharp features but for which sharp variations are to be preserved in areas where sharp geometric features are present. Additionally, when the cost term involves both values computed geometrically and values inferred by a neural network, it promotes closeness (e.g. convergence) to values that are considered more reliable than others (values for which geometric methods and Neural Network inference provide similar estimates). This can for example be useful to improve the segmentation of point clouds, which is a classic step for geometry reconstruction or analysis, or models or scenes captured as Lidar Point Cloud, using metrology equipment or rebuilt by photogrammetry. FIG. 1 shows a screenshot of an image extracted from the documentation of a well know computer vision library which shows such a segmentation. It is clear from FIG. 1 that such a segmentation can lead to primitive identification, which can be useful for reconstruction of the model beyond point cloud, for robot decision making or any other form of analysis.

Algorithms like the one used in the Point Cloud Library (PCL) (image on FIG. 1) give lower quality results when the input point clouds are noisy. A classic defect for example can be to produce over segmented results. In that type of situation, smoothing the input point cloud is not enough as it might remove interesting features from the inputs. Markov Random Fields are good tool too to smooth the output of any algorithm working on noisy point cloud but care has to be taken in order to ensure that not too much smoothing occurs in areas where is it not to be done. This implementation's energy formulation is interesting from that perspective as it ensures that much less smoothing will happen in areas where sharp geometry features are presents. In this implementation's use the local feature size associated to each vertex in the energy formulation. The local feature size is the distance to medial elements (axis or surfaces) of the point cloud (or mesh). At least rather good quality estimates of those medial elements are preferred. There are quite a few approaches that focus on generating these even for noisy inputs for example D. Rebain & al: LSMAT *Least Square Medial Axis Transform*, 2019, which is incorporated herein by reference. Thus, this implementation somehow extends the advantages of those regularization methods for medial axis elements to the field of values on which the method works over the point cloud or mesh. In this implementation the method uses two iterations of projection on average plane of neighbors.

As neural networks have demonstrated some strength in dealing with noisy inputs it is also interesting to use the aforementioned Markov Random Field to fuse predictions coming out of a neural network with the outputs of more classic algorithms. This allows fusing of the two predictions by giving more strength to predictions that agree while still applying not too much smoothing in areas corresponding to sharp features. Again, this can for example improve point cloud segmentation.

This implementation may be applied to improve point cloud segmentation for noisy inputs and thus to improve all use cases dependent on such a segmentation, such as geometry reconstruction.

This implementation comprises the four following steps:
1. Take a noisy point cloud or mesh
2. Estimate some local quantity or property (ex. Normal, curvatures, surface type)
3. Compute LFS
4. MRF optimization As a result, this implementation yields a set of values representing a distribution of the shape attribute over the real object which is smoothed in areas where the estimation was impacted by the noise in the inputs while preserving sharp variations in sharp areas of the shape of the real object.

1. Take a Noisy Point Cloud

Figure 2:
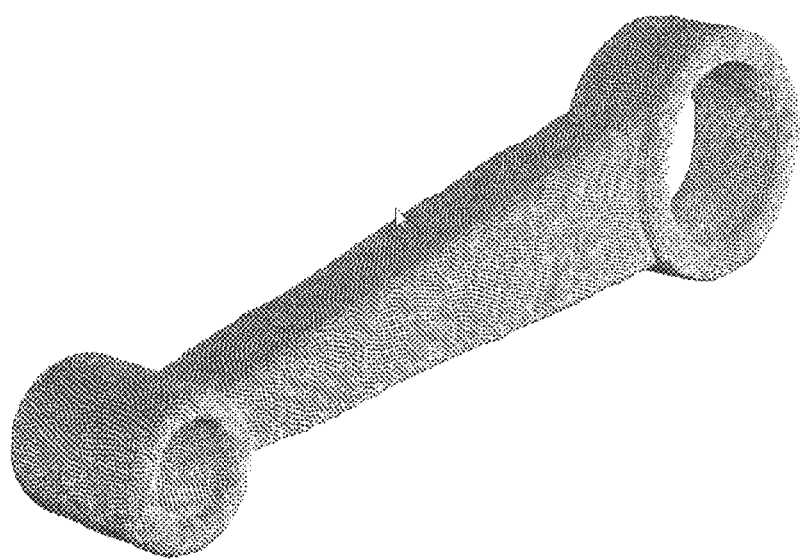

An example of such an input point cloud is given in FIG. 2, which shows a noisy point cloud.

2. Estimate Some Local Quantity or Property (Also Referred to as Shape Attribute)

Figure 3:
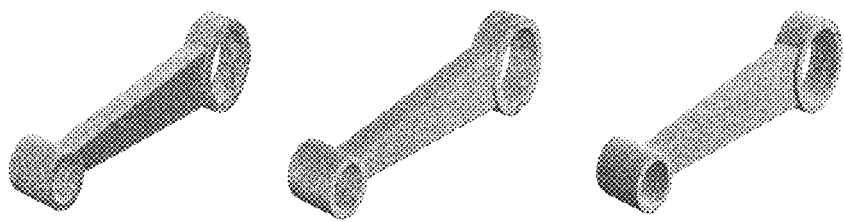

Estimate for example per point normal on that point cloud, as illustrated in FIG. 3 which shows normals inferred by a neural network.

3. Compute Local Feature Size

Figure 4:
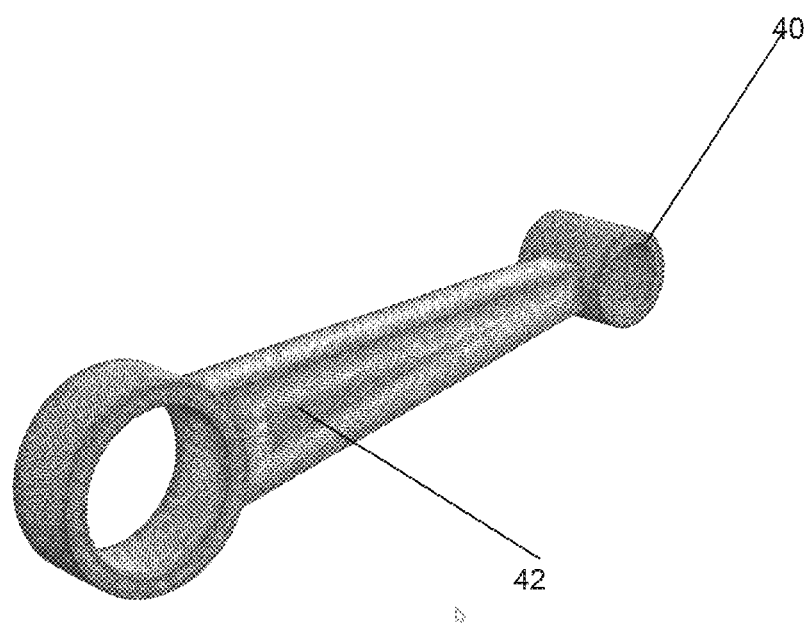
Figure 5:
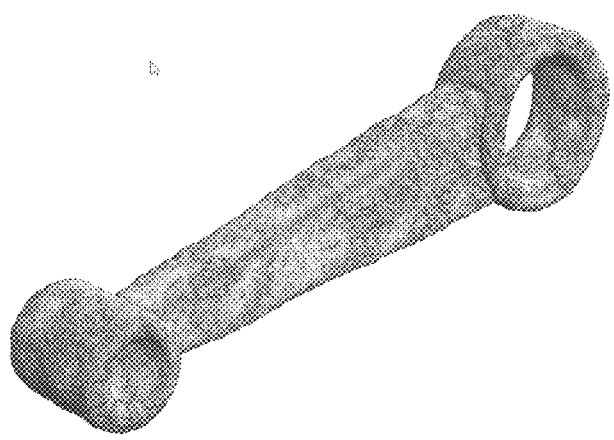

Local Feature Size can be approximated by evaluating the distance to poles (for further details see Amenta & al: *Surface Reconstruction by Voronoi Filtering*, 1999, which is incorporated herein by reference. FIG. 4 shows an example of such an evaluation, comprising small local feature size (LFS) values 40 and high LFS values 42. If the input is noisy, the LFS values may be inaccurate. FIG. 5 shows an image showing the LFS on a very noisy point cloud.

There is a long tradition of approaches that focus on generating medial elements (axis/surfaces) even for noisy inputs, one of the latest is for example described in D. Rebain & al: *LSMAT Least Square Medial Axis Transform*, 2019, which is incorporated herein by reference. Thus, somehow, this implementation extends the advantages of those regularization methods for medial axis elements to the field of values on which the method works over the point cloud or mesh. To compute the LFS visible in the image shown in FIG. 6, this implementation uses two iterations of projection on average plane of neighbors.

The smoothed point cloud is used only to compute medial elements, obviously all computations are still done on the original point cloud. For very tiny sharp features that nearly vanish in the point cloud noise, it is also possible for the MRF smoothing term to be very strong in those areas. For very noisy point clouds this simple smoothing will not be enough and in those very degenerated cases this implementation may rely on approaches like D. Rebain & al: *LSMAT Least Square Medial Axis Transform*, 2019, which is incorporated herein by reference, to obtain the medial elements that will be used to compute the local feature size which will in turn be used in the MRF. One way or another this implementation kind of extends the benefit of any regularization approach to compute the medial elements to compute the best approximation of the input.

Figure 6:
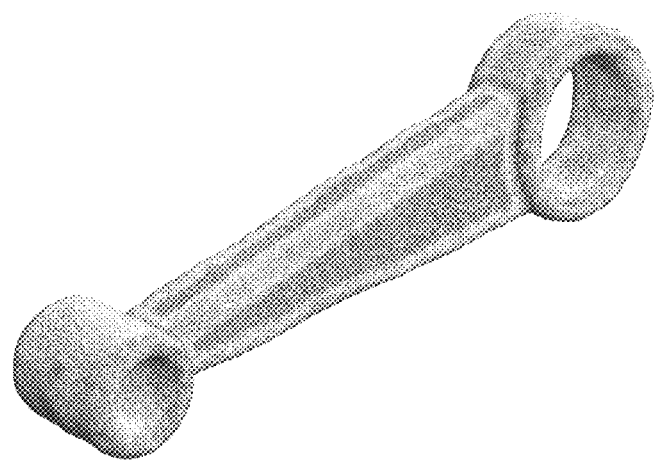

As shown in FIG. 6, the result is usable and again the smoothed point cloud is used only to compute the LFS value, the work with the MRF will still be done on the original noisy point cloud, the computed LFS value will only ensure in this case that the smoothness term is very weak in area where sharp geometric features are present.

Figure 7:
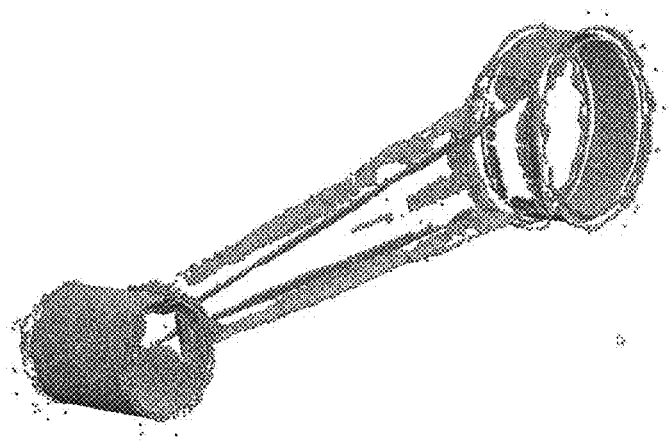

The LFS values can be approximated via distance to the nearest LFS pole, as shown in FIG. 7, which forms a good approximation of the medial surfaces and axis of the shape (again check Amenta & al: *Surface Reconstruction by Voronoi Filtering*, 1999, which is incorporated herein by reference, for a more complete description). Still this implementation is independent of the method used to compute the Local Feature Size associated with the points.

4. MRF Optimization

Behind Markov Random Fields lie the idea that any problem that can be modeled by the probability of a node of a graph to belong to a specific class (a target class) and a probability for that node to belong to a different class than its neighbors can be modeled by minimizing an energy:

$$\sum_{p \ node} E_{target}(p) + \gamma \sum_{p,q \ neighbors} E_{diff}(p, q)$$

Intuitively, the shape attribute varies very smoothly over smooth parts of the shape and more brutally in areas where sharp features are present. This implementation aims at smoothing away brutal variations in smooth parts of the real object's shape that would be the result of the noisy nature of the inputs. From the discussion above of the idea behind Markov Random Field, it appears that this mathematical tool can be useful to achieve that goal as basically the situation is that the values that should be assigned to a specific point are more likely to be near the current estimate and have a fair probability of being near the neighbors point value except in parts of the shape where sharp features are present.

This implementation notably works on point clouds. In the case of meshes, the graph to use is either the graph formed by the mesh vertices or the graph formed by the mesh faces. For point clouds, a graph is built by connecting the points with some of their neighbors. For each point the tangent plane is estimated and then the point's neighbors are projected in that plane. Then a 2D Delaunay of the projected points gives reduction of flat mesh meshing the point and the projections of its neighbors. That mesh is used to decide to which neighbors should be connected the point. In fact its associated node are connected to graph nodes associated with the points of the point cloud that did contribute projections in the tangent place that did end up being connected to the point in the 2D mesh built in the tangent plane via the Delaunay. This method may be performed in another context in (Junjie Cao & al: *Point Cloud Skeletons via Laplacian-Based Contraction* 2010, which is incorporated herein by reference).

Now a graph structure is given to the discrete representation. FIG. 4 shows the local feature size and it appears to be desirable to smooth values in areas of high LFS 42 while preserving strong variations in areas of low LFS values 40. Thus, it is interesting to formulate the smoothness term in a way so that it remains small in the blue areas even if p and q have very different target class. The scalar value is discretized and each discrete value is in fact one of those class that are referred to in this implementation.

The Smoothness term formulation may be:

$$E_{diff}(p, q) = \frac{LFS_p \times LFS_q}{maxLFS \times maxLFS} \times |p - q| \quad (2)$$

Alternatively, it may be:

$$E_{diff}(p, q) = \frac{(LFS_p - minLFS) \times (LFS_q - minLFS)}{maxLFS \times maxLFS} \times |p - q|$$

Additionally, when using several inputs, more strength is to be given to values for which the inputs do agree. This implementation's provided set of values is the a scalar field of the type "normal_x, normal_y, normal_z". The normals are discretized other 100 (or up to 1000) indexed discrete values that are the different classes that can be assigned to a specific node:

$$E_{target}(p) = (\text{geomNormal} \cdot \text{neuralNormal}) \times \tfrac{1}{2}(|p - \text{geomTarget}| + |p - \text{neuralTarget}|) \quad (3)$$

Note that when using only one input the target energy term is (in the case with two the formula 3 above in fact replaces formula 4 below):

$$E_{target}(p) = |p - \text{target}| \quad (4)$$

Above formulation in the case of two inputs is applicable when for the normal field "normal_x, normal_y, normal_z". Alternatively, the implementation may use it to work on other scalar fields provided that estimating how the normal are similar is still an indication of how much the input values associated with a specific point or vertex are valued. If instead the scalar field that has no direct relation to the normal then this implementation creates two Gaussians centered on the two inputs values and take the max of the multiplication of the two Gaussians:

$$E_{target}(p) = \max_i (geomValueGaussian(i) \times neuralValueGaussian(i)) \times \frac{1}{2}(|p - geomTarget| + |p - neuralTarget|) \quad (5)$$

geomValueGaussian and geomTarget are functions relative to the same value field defined over the point cloud or mesh, just like neuralValueGaussian and neuralTarget are also related to the same value field. i is the bucket index of a histogram that would cover the range of values of the provided set of values (again the values are discretized, and each discrete value is assimilated to a different class for the Markov Random Field).

Figure 8:
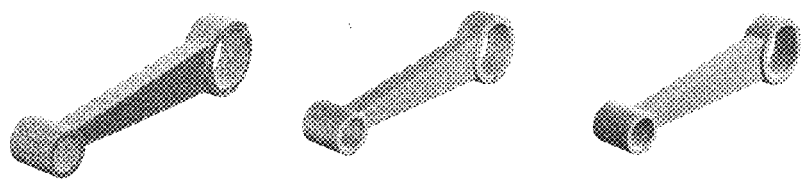

FIG. 8 shows the result of the MRF.

The method is computer-implemented. This means that steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

A typical example of computer-implementation of a method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g. one for the program, and possibly one for the database).

Figure 9:
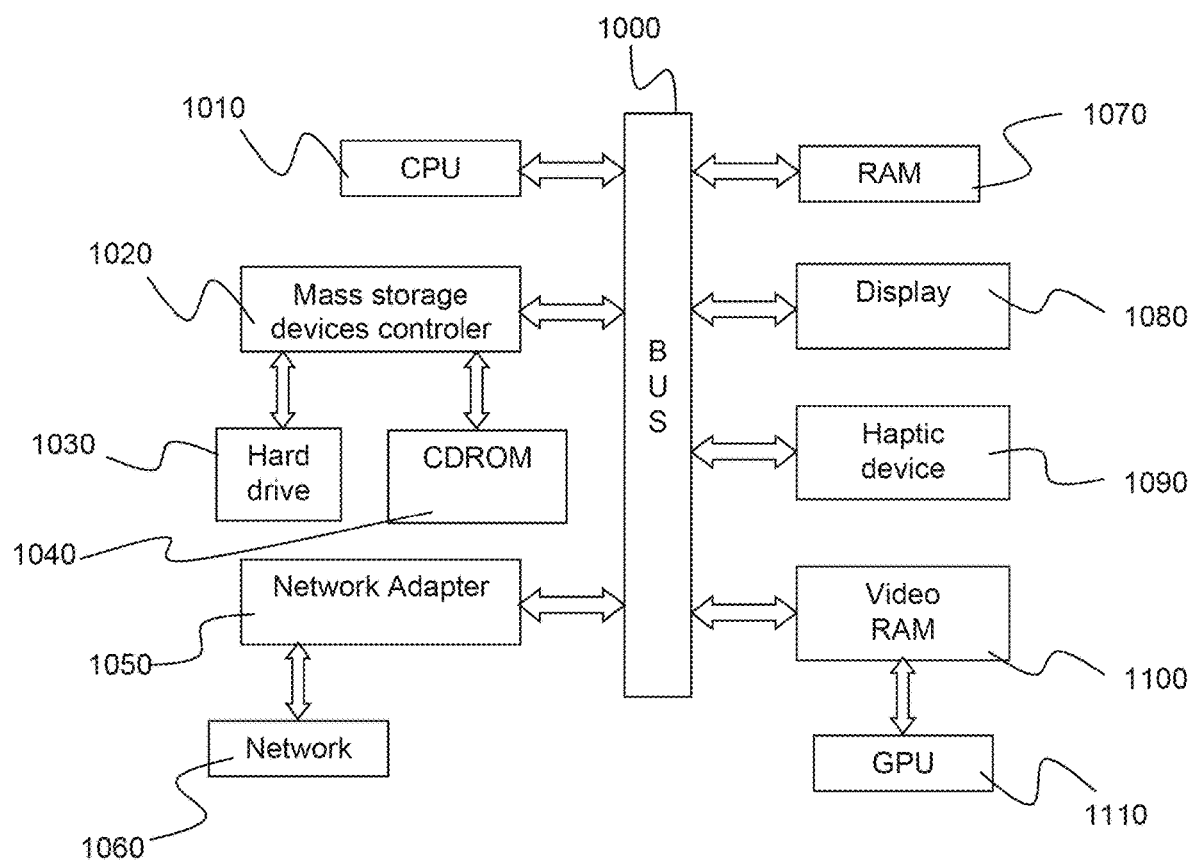
FIG. 9 shows an example of the system.

FIG. 9 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

The invention claimed is:

1. A computer-implemented method for processing a 3D signal of a shape attribute over a real object, the method comprising:
providing:
a graph having nodes and arcs, each node representing a respective point of a measured 3D discrete representation of the real object, each arc connecting two nodes representing neighboring points of the discrete representation, and
a set of values representing a distribution of the shape attribute over the real object, each value being associated to a respective node of the graph and representing the shape attribute at the respective point represented by the respective node; and
modifying the set of values by minimizing an energy defined on a Markov Random Field formed on the graph, the energy penalizing, for each arc connecting a first node to a second node, the first node being associated to a first value and the second node being associated to a second value, a highness of an increasing function of:
a distance between the first value and the second value,
a distance between a first point, represented by the first node, and a medial geometrical element of the discrete representation, and
a distance between a second point, represented by the second node, and the medial geometrical element.

2. The method of claim 1, wherein the Markov Random Field has target values representing a target distribution of the shape attribute, and the energy further penalizes, for each node, a highness of another increasing function of at least one distance between the value associated to the node and at least one target value.

3. The method of claim 2, wherein said another increasing function is an increasing function of:
a distance between the value associated to the node and a first target value, and
a distance between the value associated to the node and a second target value.

4. The method of claim 2, wherein the at least one target value comprises at least one value of the shape attribute computed geometrically at the respective point represented by the node, and/or at least one value of the shape attribute inferred by a neural network at the respective point represented by the node.

5. The method of claim 2, wherein said another increasing function also quantifies a correspondence between the values comprised in the at least one target value.

6. The method of claim 5, wherein said another increasing function is a function of a product between the correspondence and said at least one distance.

7. The method of claim 1, wherein the medial geometrical element is a medial axis of the discrete representation or a medial surface of the discrete representation.

8. The method of claim 1, wherein the discrete representation is a 3D point cloud.

9. The method of claim 1, wherein the discrete representation stems from photogrammetry and/or scan.

10. The method of claim 1, wherein the shape attribute is a normal, a curvature, or a type of primitive.

11. The method of claim 1, wherein the real object comprises at least one sharp feature.

12. The method of claim 1, wherein the method further comprises segmenting the discrete representation based on the modified set of values.

13. A non-transitory computer readable storage medium having recorded thereon a computer program comprising instructions for performing a method for processing a 3D signal of a shape attribute over a real object, the method comprising:
providing:
a graph having nodes and arcs, each node representing a respective point of a measured 3D discrete representation of the real object, each arc connecting two nodes representing neighboring points of the discrete representation; and
a set of values representing a distribution of the shape attribute over the real object, each value being associated to a respective node of the graph and representing the shape attribute at the respective point represented by the respective node; and modifying the set of values by minimizing an energy defined on a Markov Random Field formed on the graph, the energy penalizing, for each arc connecting a first node to a second node, the first node being associated to a first value and the second node being associated to a second value, a highness of an increasing function of:
- a distance between the first value and the second value,
- a distance between a first point, represented by the first node, and a medial geometrical element of the discrete representation, and
- a distance between a second point, represented by the second node, and the medial geometrical element.

14. The storage medium of claim 13, wherein the Markov Random Field has target values representing a target distribution of the shape attribute, and the energy further penalizes, for each node, a highness of another increasing function of at least one distance between the value associated to the node and at least one target value.

15. The storage medium of claim 14, wherein said another increasing function is an increasing function of:
- a distance between the value associated to the node and a first target value; and
- a distance between the value associated to the node and a second target value.

16. The storage medium of claim 14, wherein the at least one target value comprises at least one value of the shape attribute computed geometrically at the respective point represented by the node, and/or at least one value of the shape attribute inferred by a neural network at the respective point represented by the node.

17. A system comprising a processor coupled to a memory and a graphical user interface, the memory having recorded thereon a computer program comprising instructions for performing a method for processing a 3D signal of a shape attribute over a real object, the method comprising:
providing:
a graph having nodes and arcs, each node representing a respective point of a measured 3D discrete representation of the real object, each arc connecting two nodes representing neighboring points of the discrete representation; and
a set of values representing a distribution of the shape attribute over the real object, each value being associated to a respective node of the graph and representing the shape attribute at the respective point represented by the respective node; and modifying the set of values by minimizing an energy defined on a Markov Random Field formed on the graph, the energy penalizing, for each arc connecting a first node to a second node, the first node being associated to a first value and the second node being associated to a second value, a highness of an increasing function of:
a distance between the first value and the second value,
a distance between a first point, represented by the first node, and a medial geometrical element of the discrete representation, and a distance between a second point, represented by the second node, and the medial geometrical element.

18. The system of claim 17, wherein the Markov Random Field has target values representing a target distribution of the shape attribute, and the energy further penalizes, for each node, a highness of another increasing function of at least one distance between the value associated to the node and at least one target value.

19. The system of claim 18, wherein said another increasing function is an increasing function of:
a distance between the value associated to the node and a first target value; and
a distance between the value associated to the node and a second target value.

20. The system of claim 18, wherein the at least one target value comprises at least one value of the shape attribute computed geometrically at the respective point represented by the node, and/or at least one value of the shape attribute inferred by a neural network at the respective point represented by the node.

* * * * *